United States Patent
Koren et al.

(10) Patent No.: US 11,101,226 B2
(45) Date of Patent: Aug. 24, 2021

(54) METHOD FOR CONVEYING HIGH FREQUENCY MODULE AND A HIGH-FREQUENCY MODULE

(71) Applicants: Guy Koren, Rishon Lezion (IL); Ben Rubovitch, Modiin (IL)

(72) Inventors: Guy Koren, Rishon Lezion (IL); Ben Rubovitch, Modiin (IL)

(73) Assignees: DustPhotonics Ltd., Modiin (IL); XSIGHT LABS LTD., Kyriat Gat (IL)

( * ) Notice: Subject to any disclaimer, the term of this patent is extended or adjusted under 35 U.S.C. 154(b) by 0 days.

(21) Appl. No.: 16/282,304

(22) Filed: Feb. 22, 2019

(65) Prior Publication Data

US 2020/0273821 A1 Aug. 27, 2020

(51) Int. Cl.
*H01L 23/66* (2006.01)
*H01L 23/367* (2006.01)
*H01L 23/00* (2006.01)

(52) U.S. Cl.
CPC ............ *H01L 23/66* (2013.01); *H01L 23/367* (2013.01); *H01L 24/17* (2013.01); *H01L 2223/6694* (2013.01); *H01L 2924/15321* (2013.01)

(58) Field of Classification Search
None
See application file for complete search history.

(56) References Cited

U.S. PATENT DOCUMENTS

| | | | |
|---|---|---|---|
| 8,275,001 B1 * | 9/2012 | Ferguson | H04J 3/0664 370/509 |
| 2011/0155433 A1 | 2/2011 | Funaya | |
| 2012/0124257 A1 * | 5/2012 | Wu | H04L 49/405 710/106 |
| 2013/0279139 A1 * | 10/2013 | Deng | G02B 6/4279 361/807 |
| 2014/0029639 A1 | 1/2014 | Zarbock | |
| 2018/0012881 A1 | 1/2018 | Scanian | |
| 2019/0057924 A1 * | 2/2019 | Kim | H01L 23/49811 |
| 2019/0334220 A1 * | 10/2019 | Ali | H01Q 21/26 |
| 2020/0273821 A1 * | 8/2020 | Koren | H01L 23/49833 |

* cited by examiner

*Primary Examiner* — Nicholas J Tobergte
*Assistant Examiner* — Kien C Ly
(74) *Attorney, Agent, or Firm* — Reches Patent

(57) ABSTRACT

A method and a high-frequency module that includes a high frequency die that may include multiple die pads; a substrate that may include a first buildup layer, a second buildup layer and a core that is positioned between the first buildup layer and a second buildup layer; a line card that may include multiple line card pads; and multiple conductors that pass through the substrate without reaching a majority of a depth of the core, and couple the multiple die pads to the multiple line card pads.

17 Claims, 6 Drawing Sheets

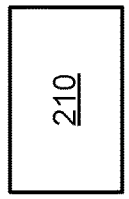
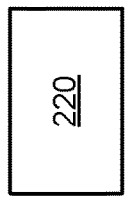
FIG. 6

METHOD FOR CONVEYING HIGH FREQUENCY MODULE AND A HIGH-FREQUENCY MODULE

BACKGROUND

In high bandwidth circuits one or more dies are mounted on a substrate (also known as a carrier) that in turn is mounted on a ball grid array that in turn is supported by a line card.

FIG. 1 illustrates a prior art module 110 that includes die 130, having die pads such as first die pad 131 and second die pad 132. The die pads are connected to bumps such as first bump 111 and second bump 112.

The bumps are positioned above substrate 150. Substrate 150 includes a top buildup layer 151, a bottom buildup layer 153 and a core 152 that is positioned between the top buildup layer and a bottom buildup layer.

A ball grid array is positioned between the substrate 150 and the line card. Ball shaped conductors of the ball grid array are electrically coupled to through traces and via structures that pass through the entire substrate 150.

A first conductive path includes a sequence of connected elements that include (from top to bottom) first die pad 131, first pad 111, first through via 113, ball shaped conductor 115, and first line card pad 117 of line card 120.

A second conductive path includes a sequence of connected elements that include (from top to bottom) second die pad 132, second pad 112, second through traces and via structures 114, ball shaped conductor 116, and second line card pad 118 of line card 120.

When the core is thick—for example reaches a thickness of one millimeter—the conductive via structure between die 130 and the line card become wide and distort high frequency signals that pass through them. Furthermore—these conductive paths have a relatively high capacitance that may limit the maximal frequency of signals that are supported by the conductive paths. For example—when the core thickness is about one millimeter the conductive paths can severely distort high frequency signals of one hundred Gigabyte per second, will require high power compensation circuits inside the die and limit the reach across the line card.

There is a growing need to electrically couple the line card to the integrated circuits in a more efficient manner.

SUMMARY OF THE INVENTION

There may be provided a high-frequency module that may include a high frequency die that may include multiple die pads; a substrate that may include a first buildup layer, a second buildup layer and a core that may be positioned between the first buildup layer and a second buildup layer; a line card that may include multiple line card pads; multiple conductors that pass through the substrate without reaching a majority of a depth of the core, and couple the multiple die pads to the multiple line card pads.

The multiple conductors may not pass through the core.

The line card may include an aperture that surrounds the high frequency die.

The high-frequency module may include a heat sink that may be connected to a top surface of the high frequency die and extends outside the aperture.

The high frequency module wherein an area of the heat sink may exceed an area of the aperture.

The high-frequency module may include a heat sink that may be thermally coupled to the high frequency die.

The high-frequency module may include a ball grid array that may be positioned between the multiple line card pads and the multiple conductors.

The high-frequency module may include a bumps that may be positioned between the multiple die pads and the multiple conductors.

The high frequency die may be a high frequency optoelectronic die.

The high frequency it not lower than one hundred gigabits per second.

The depth of the core may be not lower than a millimeter.

There may be provided a method for conveying high-frequency signals between a line card and a high frequency die of a high frequency module, the method may include outputting a first high frequency signal from a first die pad of the high frequency die; and conveying the first high frequency signal through a first conductive path to a first line card pad of the line card; wherein the first conductive path passes through a substrate without reaching a majority of a depth of a core of the substrate.

The method may include: outputting a second high frequency signal from a second line card pad of the line card; and conveying the second high frequency signal through a second conductive path to a second die pad of the high frequency die; wherein the second conductive path passes through the substrate without reaching the majority of the depth of the core of the substrate.

The high frequency die may include multiple die pads, the line card may include multiple line card pads, and the high frequency module may include multiple conductors that couple the multiple die pads to the multiple line card pads; wherein the multiple conductors pass through the substrate without reaching the majority of the depth of the core; wherein the multiple line card pads may include the first line card pad; wherein the multiple die pads may include the first die pad; and wherein the first conductive path may include a first conductor that belongs to the multiple conductors.

The line card may include an aperture that surrounds the high frequency die.

The method may include dissipating heat generated by the high frequency die by a heat sink that may be connected to a top surface of the high frequency die and extends outside the aperture.

An area of the heat sink may exceed an area of the aperture.

The method may include dissipating heat generated by the high frequency die by a heat sink that may be thermally coupled to the high frequency die.

The first conductive path may include a first pin of a ball grid array that may be positioned between the multiple line card pads and the multiple conductors.

The first conductive path may include a first bump of bumps that may be positioned between the multiple die pads and the multiple conductors.

The high frequency die may be a high frequency optoelectronic die.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 6 illustrates an example of a method

DETAILED DESCRIPTION OF THE DRAWINGS

Figure 1:
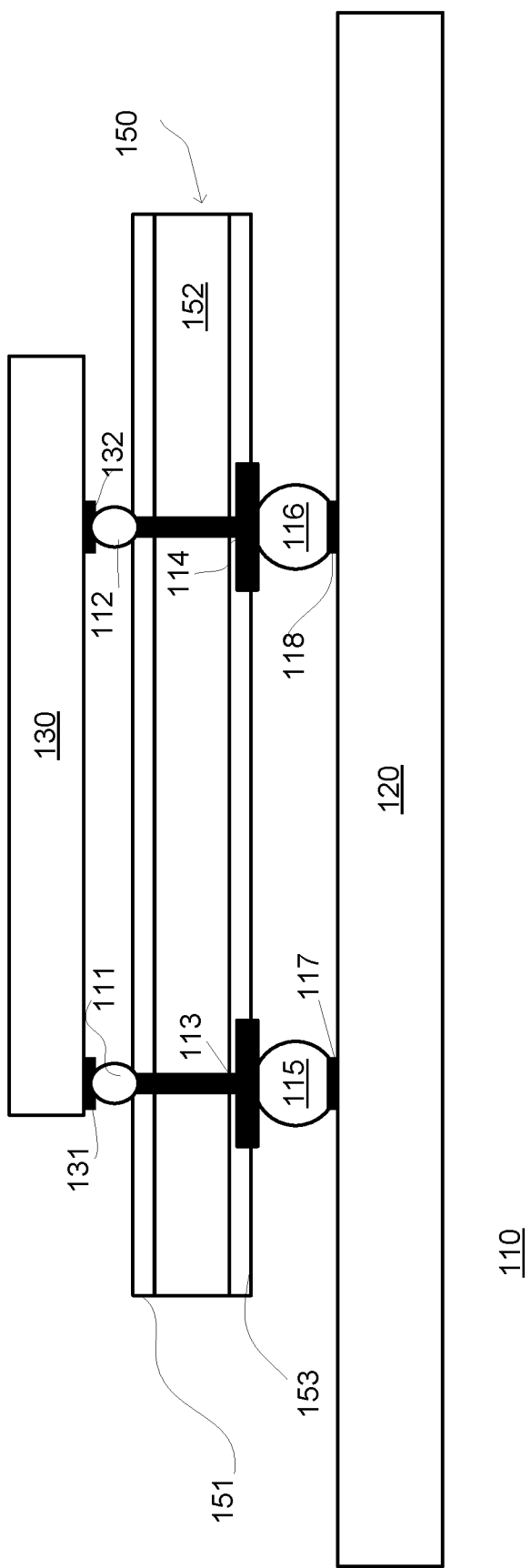
FIG. 1 illustrates a prior art module.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a module capable of executing the method.

Any reference in the specification to a module should be applied mutatis mutandis to a method that may be executed by the module.

The term "substantially"—unless stated otherwise may refer to a deviation of few percent (for example—deviation of less than ten percent or less than 20 percent).

Any combination of any module, die, circuit, or component listed in any of the figures, any part of the specification and/or any claims may be provided. Especially any combination of any claimed feature may be provided.

The term "high frequency" means at least one gigabyte per second. For example—may be equal to or exceed fifty gigabytes per second, may be equal to or exceed one gigabytes per second.

Figure 2:
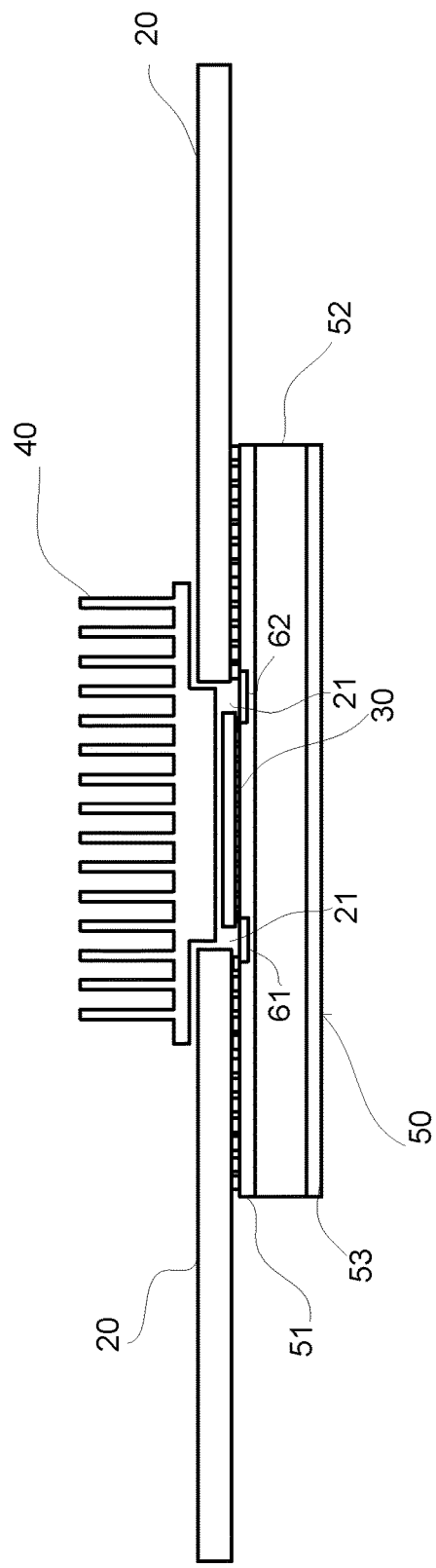
FIG. 2 illustrates an example of a high frequency module.
Figure 3:
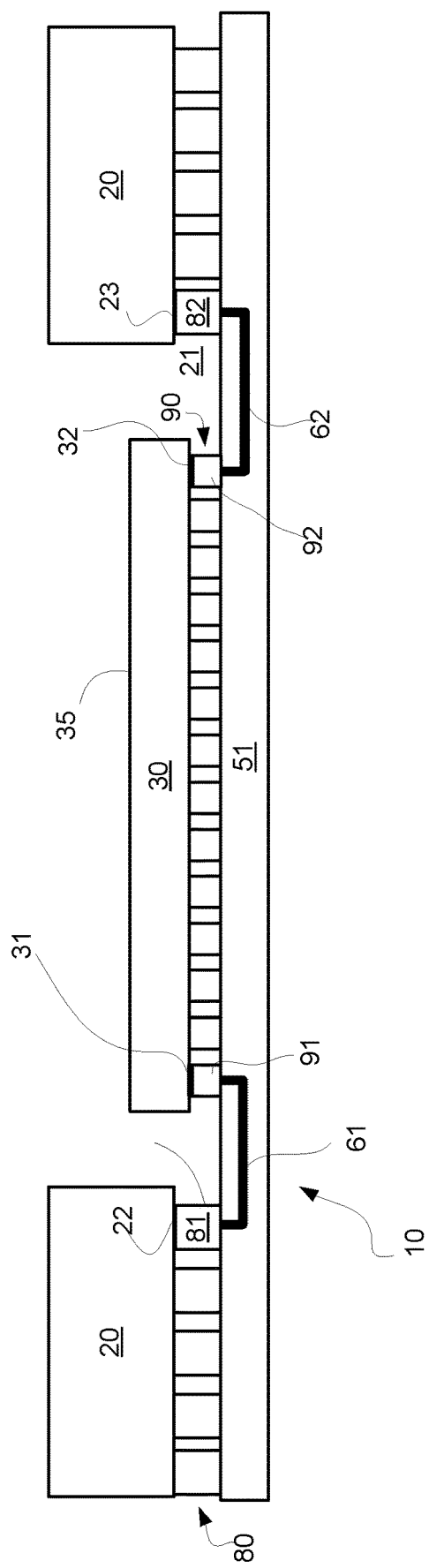
FIG. 3 illustrates an example of a high frequency module.
Figure 4:
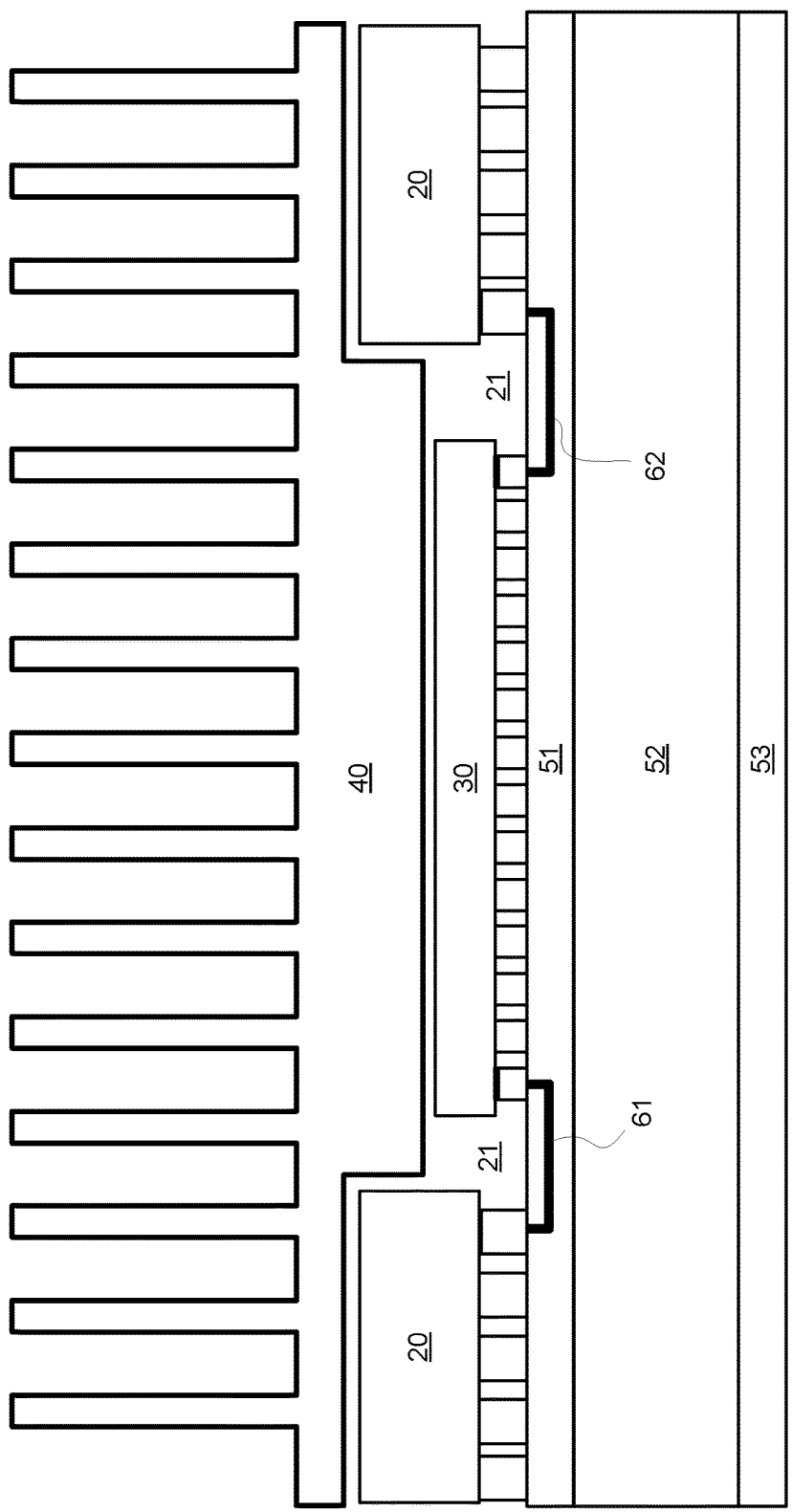
FIG. 4 illustrates an example of a high frequency module.
Figure 5:
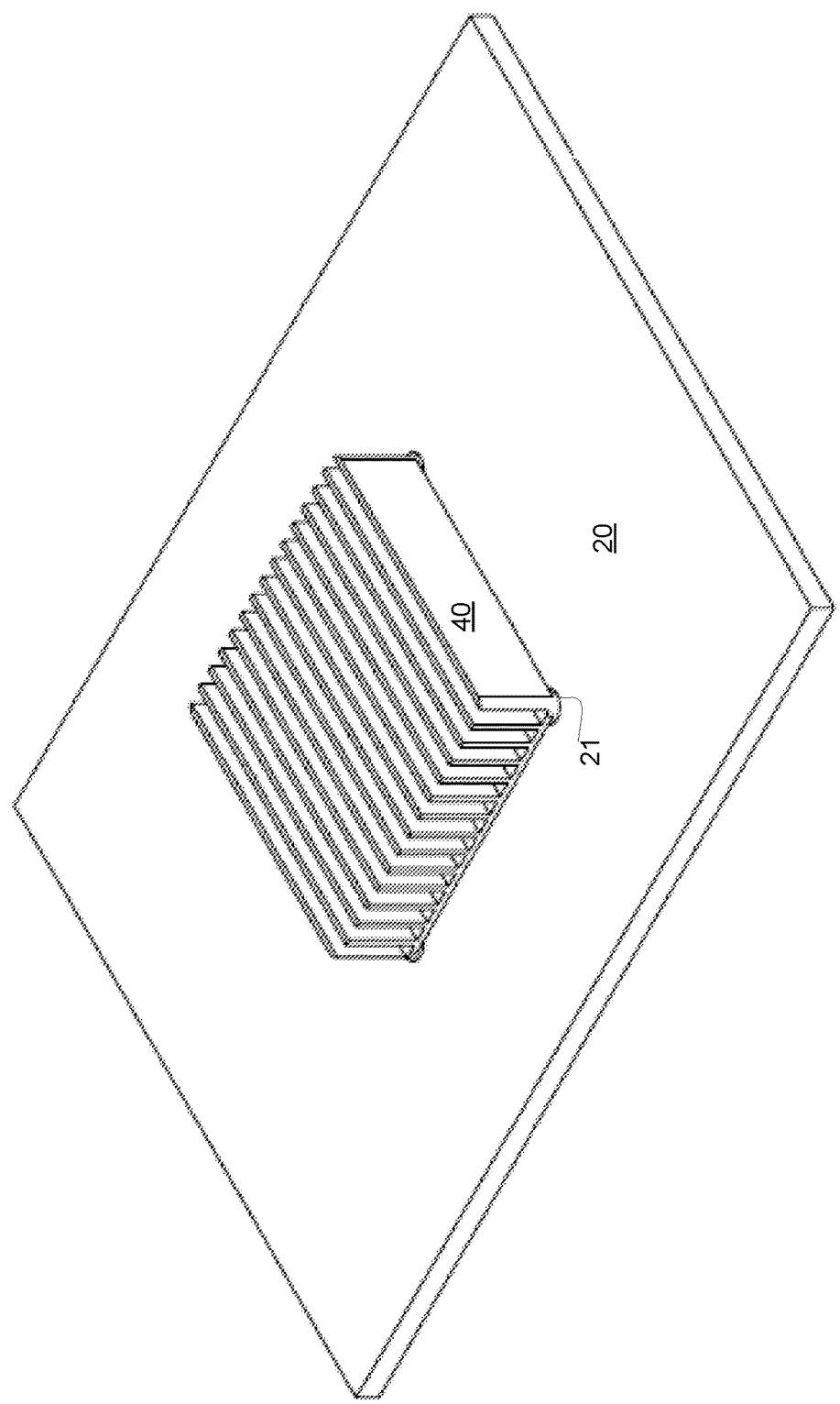
FIG. 5 illustrates an example of a high frequency module.

FIG. 2 is an example of a cross sectional view of a high frequency module 10. FIG. 3 is an example of a cross sectional view of a part of the high frequency module of FIG. 2, whereas for simplicity of explanation the heat sink of the high frequency module was omitted. FIG. 4 is an example of a cross sectional view of a part of the high frequency module of FIG. 2. FIG. 5 is an example of an isometric view of a part of the high frequency module of FIG. 2.

FIG. 2-5 illustrates a high-frequency module 10 that may include:

a. A high frequency die 30 that may include multiple die pads such as first die pad (denoted 31 in FIG. 3) and second die pad (denoted 32 in FIG. 3).

b. Substrate 50 that may include first buildup layer 51, second buildup layer 53 and core 52 that is positioned between the first buildup layer 51 and a second buildup layer 53. The substrate 50 of FIGS. 2-5 and the core 52 of FIGS. 2-5 may be much thicker then substrate 150 and core 152 of FIG. 1—while supporting high frequency signals that may exceed one hundred gigabytes per second. For example—the depth of the core may exceed one millimeter.

c. Line card 20 that may include multiple line card pads.

d. Multiple conductors that pass through the substrate 50 without reaching a majority of a depth of the core 52 and couple the multiple die pads to the multiple line card pads. In FIGS. 2-5 the conductors do not pass through core 52—but this is not necessarily so.

e. Heat sink 40.

FIGS. 2-5 illustrate two of the multiple conductors. Referring to FIG. 3—first conductor 61 is formed in the first build up layer 51 (does not pass through core 52)—and is electrically coupled between (a) first die pad 31 and first bump 91, and (b) first ball shaped conductor 81, and first line card pad 22. Second conductor 62 is formed in the first build up layer 51 (does not pass through core 52)—and is electrically coupled between (a) second die pad 32 and second bump 92, and (b) second ball shaped conductor 82, and second line card pad 23.

In FIGS. 2-5 the line card includes an aperture 21 that surrounds high frequency die 30 and exposes the top surface 35 of the high frequency die 30. The heat sink 40 may contact the top surface 35 or otherwise be thermally coupled to the high frequency die 30. For example—the heat sink 40 may be thermally coupled to the high frequency die via a conductive paste or intermediate material positioned between the heat sink the high frequency die 30.

The area of the heat sink 40 may be larger than the area of the aperture 21. The heat sink 40 may extend to the sides of the aperture 21 and have a part that is positioned directly above a part of the line card 20.

The high frequency die 30 may receive and/or transmit high frequency signals—for example of a rate that equal or exceed fifty gigabytes per second.

The first die may be a CMOS ASIC or may be fabricated by other manufacturing processes. The first die may be a switch, any communication die, a processor, an optoelectronic die, and the like. For example—it is assumed that the first die is a high bandwidth ASIC such as a switch, specifically an Ethernet, InfiniBand or OmniPath switch. It is noted that the first die may differ from an ASIC. It may, for example, be a field programmable gate array (FPGA).

FIG. 6 illustrates method 200 for conveying high-frequency signals between a line card and a high frequency die of a high frequency module. The high frequency module may be any of the high frequency modules mentioned above.

Method 200 may start by at least one step out of steps 210 and 220.

Step 210 may include (a) outputting a first high frequency signal from a first die pad of the high frequency die; and (b) conveying the first high frequency signal through a first conductive path to a first line card pad of the line card. The first conductive path passes through a substrate without reaching the core of the substrate.

Step 220 may include (a) outputting a second high frequency signal from a second line card pad of the line card; and (b) conveying the second high frequency signal through a second conductive path to a second die pad of the high frequency die; wherein the second conductive path passes through the substrate without reaching the majority of the depth of the core of the substrate.

The high frequency die executing method 200 may include multiple die pads, the line card comprises multiple line card pads, and the high frequency module comprises multiple conductors that couple the multiple die pads to the multiple line card pads; wherein the multiple conductors pass through the substrate without reaching the majority of the depth of the core; wherein the multiple line card pads comprise the first line card pad; wherein the multiple die pads comprises the first die pad; and wherein the first conductive path comprises a first conductor that belongs to the multiple conductors.

Method 200 may also include step 230 of dissipating heat generated by the high frequency die by a heat sink that is connected to a top surface of the high frequency die and extends outside the aperture.

Step 230 may be executed in parallel to step 210 and/or in parallel to step 230.

The terms "including", "comprising", "having", "consisting" and "consisting essentially of" are used in an interchangeable manner. For example—any module or die may include at least the components included in the figures and/or in the specification, only the components included in the figures and/or the specification.

Any reference to the phrases "may" or "may be" should be applied to the phrases "may not" or "may not be".

The phrase "and/or" means additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between blocks are merely illustrative and that alternative embodiments may merge blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A high-frequency module, comprising:
   a high frequency die that comprises multiple die pads;
   a substrate that comprises a first buildup layer, a second buildup layer and a core that is positioned between the first buildup layer and the second buildup layer;
   a line card that comprises multiple line card pads;
   multiple conductors that pass through the substrate without reaching a majority of a depth of the core, and couple the multiple die pads to the multiple line card pads.

2. The high-frequency module according to claim 1 wherein the multiple conductors do not pass through the core.

3. The high-frequency module according to claim 1 wherein the line card comprises an aperture that surrounds the high frequency die.

4. The high-frequency module according to claim 3 comprising a heat sink that is connected to a top surface of the high frequency die and extends outside the aperture.

5. The high frequency module according to claim 4 wherein an area of the heat sink exceeds an area of the aperture.

6. The high-frequency module according to claim 1 comprising a heat sink that is thermally coupled to the high frequency die.

7. The high-frequency module according to claim 1 comprising a ball grid array that is positioned between the multiple line card pads and the multiple conductors.

8. The high-frequency module according to claim 1 comprising bumps that are positioned between the multiple die pads and the multiple conductors.

9. The high-frequency module according to claim 1 wherein the high frequency die is a high frequency optoelectronic die.

10. The high-frequency module according to claim 1 wherein the high frequency is a finite frequency and is not lower than one hundred gigabits per second.

11. The high-frequency module according to claim 1 wherein the depth of the core is not lower than a millimeter.

12. The high-frequency module according to claim 1 wherein the multiple conductors belong to multiple conductive paths, the multiple conductive paths consist essentially of the multiple conductors pass through the substrate without reaching the majority of the depth of the core, and couple the multiple die pads to the multiple line card pads.

13. The high-frequency module according to claim 1 consisting essentially of the high frequency die, the substrate, the line card, the multiple conductors and a heat sink.

14. The high-frequency module according to claim 1 wherein the substrate is positioned below the high frequency die and below the line card.

15. The high-frequency module according to claim 1 wherein the line card comprises an aperture that surrounds the high frequency die, wherein the high-frequency module comprises a heat sink that is thermally coupled to the high frequency die, wherein a first portion of the heat sink passes through the aperture and a second portion of the heat sink extends outsides the aperture, wherein a length of the second portion exceeds a length of the aperture.

16. The high-frequency module according to claim 1 comprising a heat sink, wherein the first portion of the heat sink contacts the high frequency die.

17. The high-frequency module according to claim 1 comprising a heat sink, wherein the first portion of the heat sink is thermally coupled to the high frequency die without contacting the high frequency die.

* * * * *